(12) United States Patent
Hsu et al.

(10) Patent No.: US 11,417,581 B2
(45) Date of Patent: Aug. 16, 2022

(54) PACKAGE STRUCTURE

(71) Applicant: PHOENIX PIONEER TECHNOLOGY CO., LTD., Hsinchu County (TW)

(72) Inventors: Shih-Ping Hsu, Hsinchu County (TW); Chin-Wen Liu, Hsinchu County (TW); Tang-I Wu, Hsinchu County (TW); Shu-Wei Hu, Hsinchu County (TW)

(73) Assignee: PHOENIX PIONEER TECHNOLOGY CO., LTD., Hsinchu County (TW)

( * ) Notice: Subject to any disclaimer, the term of this patent is extended or adjusted under 35 U.S.C. 154(b) by 497 days.

(21) Appl. No.: 15/997,845

(22) Filed: Jun. 5, 2018

(65) Prior Publication Data

US 2018/0315678 A1    Nov. 1, 2018

Related U.S. Application Data

(62) Division of application No. 14/801,173, filed on Jul. 16, 2015, now Pat. No. 10,079,190.

(30) Foreign Application Priority Data

Nov. 10, 2014  (TW) .................................. 103138884

(51) Int. Cl.
*H01L 23/31*  (2006.01)
*H01L 23/498*  (2006.01)
(Continued)

(52) U.S. Cl.
CPC ...... *H01L 23/3128* (2013.01); *H01L 21/4832* (2013.01); *H01L 23/49861* (2013.01);
(Continued)

(58) Field of Classification Search
CPC .. H05K 1/00; H05K 1/02; H05K 1/14; H05K 1/18; H05K 1/141–144;
(Continued)

(56) References Cited

U.S. PATENT DOCUMENTS 6,562,660 B1     5/2003  Sakamoto et al.
6,635,957 B2 *  10/2003  Kwan ................. H01L 21/4832
                                                                      257/691

(Continued)

OTHER PUBLICATIONS

U.S. Appl. No. 14/801,173, filed Jul. 16, 2015.
(Continued)

*Primary Examiner* — Tuan T Dinh
(74) *Attorney, Agent, or Firm* — Amin, Turocy & Watson, LLP

(57) ABSTRACT

A semiconductor package is provided and includes: an insulative layer having opposing first and second surfaces; a wiring layer embedded in the insulative layer and having a first side that is exposed from the first surface of the insulative layer and a second side opposing the first side and attached to the second surface of the insulative layer; at least one electronic component mounted on the second side of the wiring layer and electrically connected to the wiring layer; and an encapsulating layer formed on the second side of the wiring layer and the second surface of the insulative layer and encapsulating the electronic component. Therefore, the (Continued)

single wiring layer is allowed to be connected to the electronic component on one side and connected to solder balls on the other side thereof to shorten the signal transmission path.

5 Claims, 3 Drawing Sheets

(51) Int. Cl.
*H01L 21/48* (2006.01)
*H01L 21/56* (2006.01)

(52) U.S. Cl.
CPC ........ *H01L 21/56* (2013.01); *H01L 23/49816* (2013.01); *H01L 23/49827* (2013.01); *H01L 2224/16225* (2013.01); *H01L 2224/32225* (2013.01); *H01L 2224/48091* (2013.01); *H01L 2224/48247* (2013.01); *H01L 2224/73204* (2013.01); *H01L 2924/15311* (2013.01); *H01L 2924/181* (2013.01); *Y10T 29/49146* (2015.01)

(58) Field of Classification Search
CPC ........ H05K 1/181–187; H01L 21/4828; H01L 21/4832; H01L 23/3128; H01L 23/49861
USPC ................. 361/760–767, 782, 795, 803; 174/520–525, 258–264
See application file for complete search history.

(56) References Cited

U.S. PATENT DOCUMENTS

| | | | |
|---|---|---|---|
| 6,777,788 B1 * | 8/2004 | Wan ................. | H05K 3/341 |
| | | | 257/676 |
| 7,344,920 B1 | 3/2008 | Kirloskar et al. | |
| 9,331,003 B1 | 5/2016 | Camacho et al. | |
| 9,698,282 B2 * | 7/2017 | Jaeger ................ | H01L 31/18 |
| 10,511,138 B2 * | 12/2019 | Wojcik ............... | H01S 5/024 |
| 2006/0151862 A1 * | 7/2006 | Lin .................... | H01L 21/565 |
| | | | 257/676 |
| 2009/0039496 A1 * | 2/2009 | Beer .................. | H01L 24/19 |
| | | | 257/693 |
| 2010/0019370 A1 * | 1/2010 | Pressel ............... | H01L 21/568 |
| | | | 257/690 |
| 2014/0041922 A1 * | 2/2014 | Sun ................... | H01L 21/486 |
| | | | 174/264 |

OTHER PUBLICATIONS

Non-Final Office Action for U.S. Appl. No. 14/801,173 dated Jun. 20, 2017.
Final Office Action for U.S. Appl. No. 14/801,173 dated Dec. 29, 2017.

* cited by examiner

PACKAGE STRUCTURE

CROSS-REFERENCE TO RELATED APPLICATIONS

This application is a Divisional of application Ser. No. 14/801,173 filed on Jul. 16, 2015, the entire contents of which are incorporated herein by reference.

BACKGROUND OF THE INVENTION

1. Field of the Invention

The present invention relates to package structures, and, more particularly, to a single-layered package structure and a method of fabricating the same.

2. Description of Related Art

With the advancement in the technology of semiconductor package, various semiconductor devices have been developed and incorporated in smart phones, tablets, internet, and notebooks in a variety of forms, such as ball grid array (BGA), Quad-Flat Package (QFP) or Quad Flat Nonlead Package (QFN).

As shown in FIG. 1A, a conventional QFP package structure 1 comprises: a carrier 10, a plurality of leads 11 surrounding the carrier 10, an electronic component 12 adhered to the carrier 10 and electrically connected to the leads 11 by a plurality of bonding wires 120, and an insulative layer 13 such as an encapsulant that encapsulates the electronic component 12, the carrier 10, the bonding wires 120 and the leads 11, wherein the leads 11 protrude from the insulative layer 13.

However, in the conventional method of fabricating the QFP package structure 1, the carrier 10 and the leads 11 are structured into a leadframe. Therefore, the wiring arrangement, including the layout of wiring and I/O connections, is restricted. For instance, in a conventional leadframe, the number of I/O components and pitch of the leads 11 are restricted by the total length of leads 111 arranged in row which is around 400 μm and the total length of the carrier 10 which is 125 μm.

Moreover, during the packaging process, owing to the fixed size of the leadframe and the height of the bonding wires 120, the overall size of QFP package structure 1 could not be thinner.

Moreover, in a conventional QFP package structure 1, owing to the design of the leadframe, the number of leads 11, i.e., the I/O contacts are less, and it is difficult to meet the demand for high I/O connections and low profile.

As shown in FIG. 1B, a conventional BGA package structure 1' allows more I/O connections to be incorporated in a same unit area of a package substrate, for meeting the requirement for a chip with high integration. The package structure 1' comprises a carrier 10' having a wiring layer 11a, 11b on the top side 10a and bottom side 10b thereof; an electronic component 12 disposed on the top side 10a of the carrier 10' and electrically connected to the wiring layer 11a via a plurality of conductive bumps 120'; an insulative layer 13 such as an underfill that encapsulates the conductive bumps 120'; and conductive elements 14 such as solder balls formed on the wiring layer 11b of the bottom side 10b of the carrier 10'. The conductive pillars 100 are electrically connected with the wiring layer 11a, 11b. After the electronic component 12 is electrically connected to the carrier 10' by wire bonding or flip chip method, conductive elements 14 are formed on the wiring layer 11b of the bottom side 10b of the carrier 10' for forming external electrical connections, so as to reach high number of leads.

However, the conventional BGA package structure 1' still poses a problem that the signal transmission path (formed by the conductive elements 14, the wiring layers 11a and 11b, and conductive pillars 100) is too long, whereby the electrical performance of the package structure 1' during high frequency use or high operational speed is undesirably limited.

Moreover, the conventional BGA package structure 1' requires fabricating at least two wiring layers 11a and 11b and the conductive pillars 100 (such as drilling, platting copper materials in vias for forming electrical connections between the two layers). Thus, it is difficult for the overall structure to meet the low profile requirement, and hard to reduce the fabricating cost due to the complexity of the fabricating process.

In addition, the conventional BGA package structure 1' requires many interfaces to be fabricated (such as those between the conductive elements 14, wiring layer 11a, 11b and conductive pillars 100), as well as using a hybrid carrier 10' having a plurality of layers made of different materials, whereby delamination tends to incur and is undesirably increased.

Further, as the carrier 10' is composed of multiple layers made of different materials, the thermal expansion coefficient (CTE) of each layer is different. As a result, CTE mismatch would result in warpage during the fabricating process.

Therefore, there is an urgent need in solving the foregoing problems.

SUMMARY OF THE INVENTION

In view of the above-mentioned drawbacks of the prior art, the present invention provides a semiconductor package, comprising: an insulative layer having opposing first and second surfaces; a wiring layer embedded in the insulative layer and having a first side that is exposed from the first surface of the insulative layer and a second side opposing the first side and attached to the second surface of the insulative layer; at least one electronic component mounted on the second side of the wiring layer and electrically connected to the wiring layer; and an encapsulating layer formed on the second side of the wiring layer and the second surface of the insulative layer and encapsulating the electronic component.

The present invention further provides a method of fabricating a package structure, comprising: providing a conductive layer having opposing first and second sides; removing a portion of the first side of the conductive layer to form a plurality of openings on the first side of the conductive layer; forming an insulative material in the openings, allowing the insulative material to serve as an insulative layer that has a first surface, from which the first side of the conductive layer is exposed, and a second surface opposing the first surface; removing a portion of the second side of the conductive layer to allow the conductive layer to serve as a wiring layer, with the second surface of the insulative layer exposed from the second side of the wiring layer; disposing on the second side of the wiring layer at least one electronic component that is electrically connected to the wiring layer; and forming on the second side of the wiring layer and the second surface of the insulative layer an encapsulating layer that encapsulates the at least one electronic component.

In summary, the package structure and the method of fabricating the same according to the present invention merely employs a single wiring layer, allowing one side of the wiring layer to be coupled to the electronic components, while the other side thereof to be coupled to the soldering balls, resulting in shortened signal path and reduced signal loss, thereby increasing the electronic performance.

Moreover, as the package structure according to the present invention only requires fabricating one wiring layer, without the need of fabricating conductive pillars or vias, this not only greatly reduces the thickness of the package structure for meeting the low profile requirement, but also greatly reduces the fabricating cost.

Further, since the single wiring layer of the package structure according to the present invention merely generates two interfaces, the problem of delaminations can be prevented from occurrence. In addition, as the conductive layer is directly patterned to form the wiring layer, the fabricating cost can be greatly reduced.

In addition, since the insulative layer of the present invention is made of a single material, unlike the conventional carrier has layers made of different materials, the problem of CTE mismatch, which causes warpage can be prevented from occurrence.

DETAILED DESCRIPTION OF THE PREFERRED EMBODIMENTS

The present invention is described in the following with specific embodiments, so that one skilled in the pertinent art can easily understand other advantages and effects of the present invention from the disclosure of the present invention.

It should be noted that all the drawings are not intended to limit the present invention. Various modification and variations can be made without departing from the spirit of the present invention. Further, terms, such as "first", "second", "one" and etc., are merely for illustrative purpose and should not be construed to limit the scope of the present invention.

FIGS. 2A-2G are cross-sectional schematic views showing a method of fabricating a package structure 2 according to the present invention.

Figure 1A:
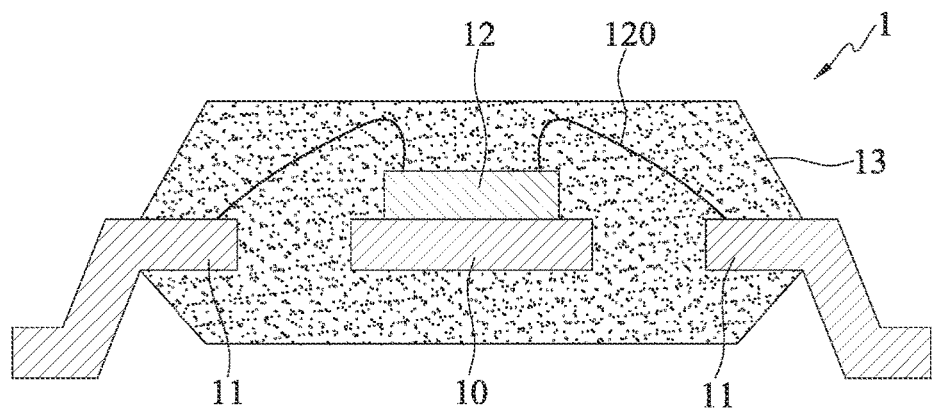
FIG. 1A is a cross-sectional schematic view of a conventional QFP package structure.
Figure 1B:
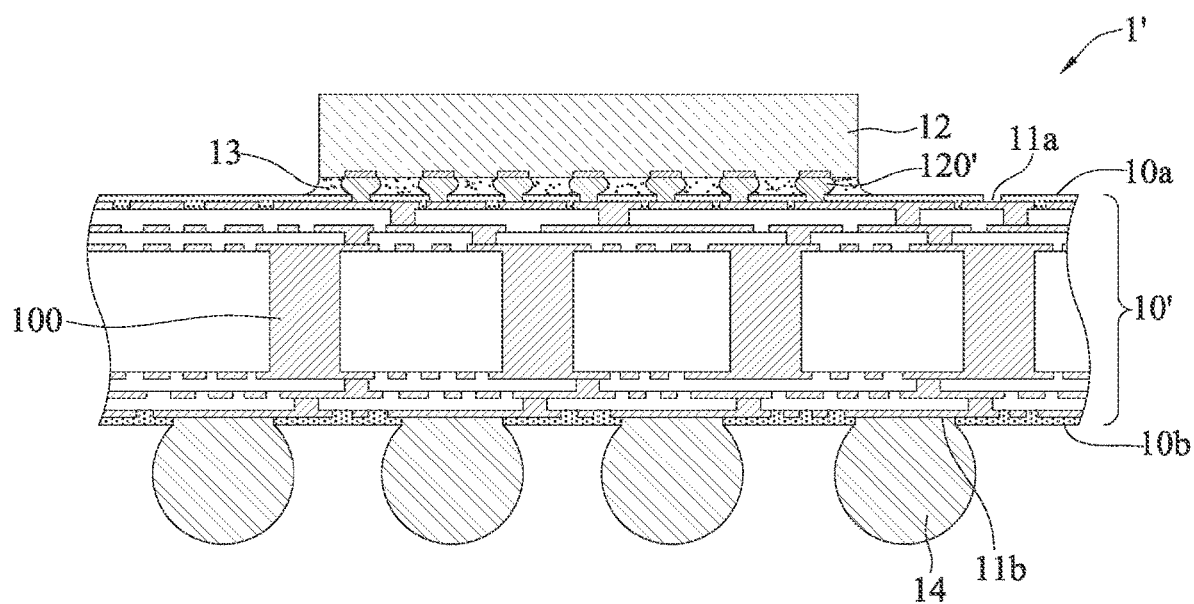
FIG. 1B is a cross-sectional schematic view of a conventional BGA package structure.
Figure 2A:
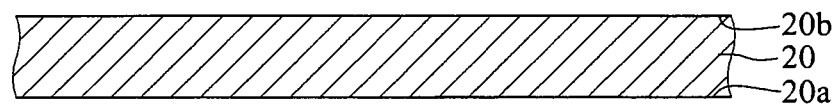
FIGS. 2A-2H are cross-sectional schematic views showing a method of fabricating a package structure according to the present invention.

As shown in FIG. 2A, a conductive layer 20 having a first side 20a and an opposing second side 20b is provided.

In an embodiment, the conductive layer 20 is formed of a metal material such as copper, but is not limited thereto.

Figure 2B:
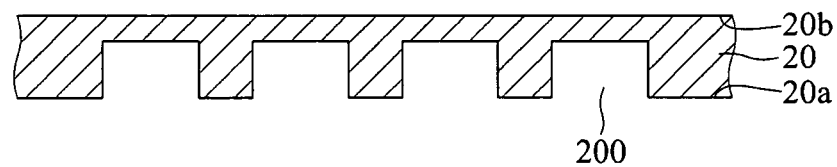

As shown in FIG. 2B, a patterning process is performed to etch away a portion of the first side 20a of the conductive layer 20, for forming a plurality of openings 200 via the first side 20a of the conductive layer 20.

Figure 2C:
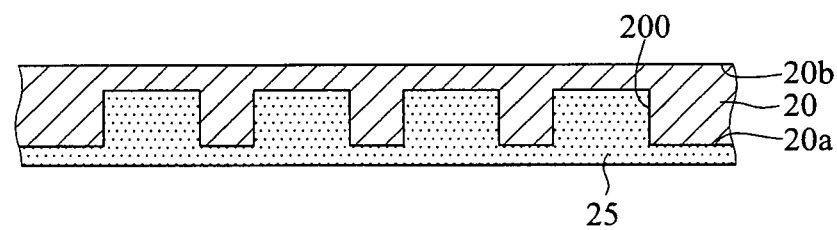

As shown in FIG. 2C, an insulative material is formed on the first side 20a of the conductive layer 20 and in the openings 200, allowing the insulative material to serve as an insulative layer 25 that completely covers the first side 20a of the conductive layer 20.

In an embodiment, the insulative layer 25 is made of a primer or a dielectric material.

Figure 2D:
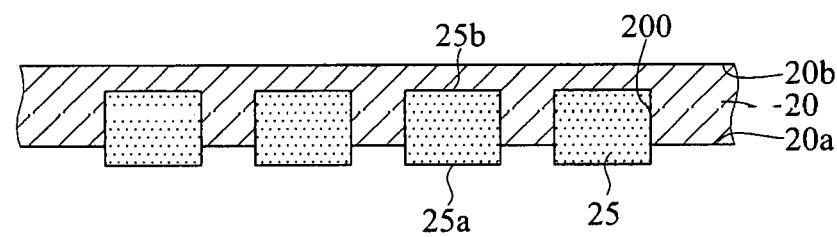

As shown in FIG. 2D, a portion of the insulative material of the first side 20a of the conductive layer 20 is removed, with a portion of the insulative material corresponding to the openings 200 remained, such that the insulative layer 25 has a first surface 25a and an opposing second surface 25b, and the first side 20a of the conductive layer 20 is exposed from first surface 25a of the insulative layer 25.

Figure 2E:
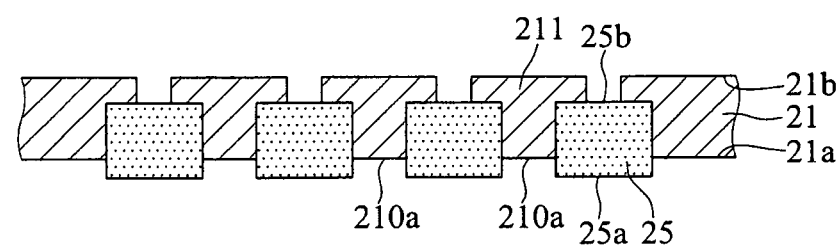

As shown in FIG. 2E, a patterning process is performed to remove a portion of the second side 20b of the conductive layer 20, allowing the conductive layer 20 to serve as a wiring layer 21, and the second surface 25b of the insulative layer 25 to be exposed from the second side 21b of the wiring layer 21.

In an embodiment, the first side 21a of the wiring layer 21 is defined as having a plurality of conductive pads 210a.

The wiring layer 21 further comprises a plurality of conductive traces 211 to extendingly and electrically connect with the conductive pads 210a.

In another embodiment, a flattening process (such as grinding the insulative layer 25) is performed, to allow the first side of the wiring layer to be flush with the first surface of the insulative layer.

Figure 2F:
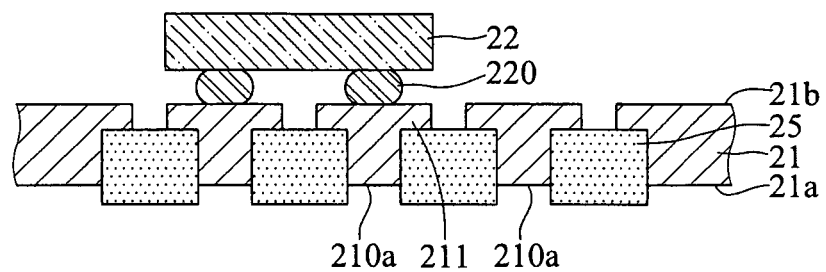

As shown in FIG. 2F, at least one electronic component 22 is mounted on the second side 21b of the wiring layer 21, and the electronic component 22 is electrically connected with the wiring layer 21.

In an embodiment, the electronic component 22 is an active component such as a semiconductor element (a chip), a passive component, such as a resistor, a capacitor and an inductor, or a combination thereof.

Further, the electronic component 22 is electrically connected to the conductive pads 210a via a plurality of conductive bumps 220 and conductive traces 211.

Figure 2G:
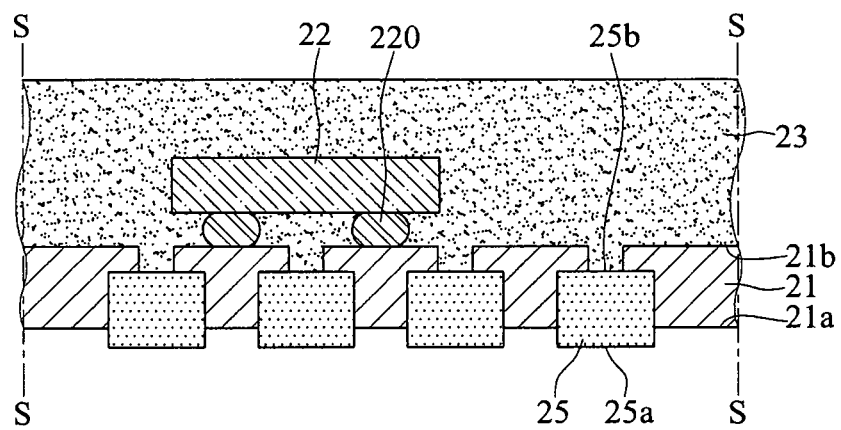

As shown in FIG. 2G, an encapsulating layer 23 is formed on the second side 21b of the wiring layer 21 and the second surface 25b of the insulative layer 25, and encapsulates the electronic components 22 and the conductive bumps 220.

In an embodiment, the encapsulating layer 23 is formed on the carrier 20 by molding, coating or lamination method. The encapsulating layer 23 is made of a molding compound, a primer, or a dielectric material such as epoxy resin.

In an embodiment, the top surface of the electronic component 22 may be exposed from the top surface of the encapsulating layer 23.

In an embodiment, it is applicable to form the underfill (not shown) to encapsulate the conductive bumps 220, before the encapsulating layer 23 is formed.

Figure 2H:
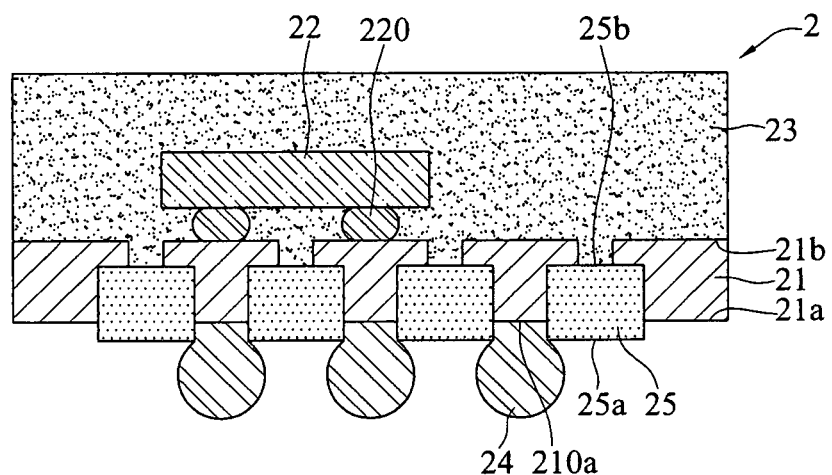

As shown in FIG. 2H, a plurality of conductive elements 24 such as solder balls are formed on the first surface 25a of the insulative layer 25, and a singulation process is performed along the cutting path S as shown in FIG. 2G, to obtain the plurality of package structures 2.

In an embodiment, the conductive elements 24 are coupled and electrically connected to the conductive pads 210a of the wiring layer 21, so as for another electronic devices to be stacked thereon via the conductive elements 24 (not shown).

In the method of fabricating the package structure 2, as merely the single wiring layer 21 is used, the second side 21b of the wiring layer 21 is coupled to the electronic component 22, and the first side 21a is coupled to the conductive elements 24, the signal pathway as well as the signal loss can be reduced, thereby significantly increasing the electrical performance.

Since the package structure 2 according to the present invention requires only one wiring layer 21 to be fabricated, without the need of fabricating the conductive pillars, the overall thickness of the package structure 2 is reduced for meeting the low-profile requirement, and the fabricating cost is also greatly reduced.

Further, since the single wiring layer 21 of the package structure 2 according to the present invention merely generates two interfaces (the first side 21a and second side 21b), the problem of delamination due to a high number of interfaces can be prevented. Besides, as the conductive layer 20 is directly patterned to form the wiring layer 21, the fabricating cost can be greatly reduced.

In addition, since the insulative layer 25 according to the present invention is made of a single material, rather than different material required for a conventional carrier, the problem of warpage caused by CTE masmatch can be prevented.

The package structure 2 comprises: an insulative layer 25, a wiring layer 21, at least one electronic component 22, and an encapsulating layer 23.

The insulative layer 25 has a first surface 25a and an opposing second surface 25b.

The wiring layer 21 is embedded in the insulative layer 25, and the wiring layer 21 has a first side 21a and an opposing second side 21b. The first side 21a of the wiring layer 21 is exposed from the first surface 25a of the insulative layer 25, and the second side 21b of the wiring layer 21 is attached to the second surface 25b of the insulative layer 25.

The electronic component 22 is formed on the second side 21b of the wiring layer 21 and electrically connected to the wiring layer 21. In an embodiment, the electronic component 22 is an active component, a passive component, or a combination thereof, and the electronic component 22 is electrically connected to the second side 21b of the wiring layer 21 in a flip-chip manner.

The encapsulating layer 23 is formed on the second side 21b of the wiring layer 21 and the second surface 25b of the insulative layer 25 and encapsulates the electronic components 22.

In an embodiment, the second side 21b of the wiring layer 21 is for the electronic component 22 to be mounted thereon, and the first side 21a of the wiring layer 21 has a plurality of conductive pads 210a.

In an embodiment, the first side 21a of the wiring layer 21 is flush with the first surface 25a of the insulative layer 25.

In an embodiment, the package structure 2 further comprises a plurality of conductive elements 24 coupled to the first surface 25a of the insulative layer 25 and electrically connected to the first side 21a of the wiring layer 21.

The present invention has been described using exemplary preferred embodiments. However, it is to be understood that the scope of the present invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A package structure, comprising:
   a single insulative layer having opposing first and second surfaces;
   a wiring layer embedded in the single insulative layer and having a first side that is exposed from the first surface of the single insulative layer and a second side opposing the first side and attached to the second surface of the single insulative layer, wherein the second side of the wiring layer comprises a plurality of conductive traces, the conductive traces are protruded from the second surface of the single insulative layer, the first side of the wiring layer is defined to have a plurality of conductive pads thereon, and the conductive pads are integrally formed with the conductive traces and exposed from the first surface of the single insulative layer, the first side of the wiring layer is recessed on the first surface of the single insulative layer and is bonded with a plurality of conductive elements, the wiring layer is formed by integrally etching a metal plate and has a T shape, and a horizontal side of the T-shaped wiring layer is a chip-placement side, and a vertical side of the T-shaped wiring layer is a ball-placement side;
   at least one electronic component mounted on the conductive traces of the second side of the wiring layer and electrically connected to the conductive traces; and
   an encapsulating layer formed on the second side of the wiring layer and the second surface of the single insulative layer and encapsulating the electronic component, wherein the wiring layer is covered by the encapsulating layer and supported by the single insulative layer.

2. The package structure of claim 1, wherein the second side of the wiring layer is electrically connected to the electronic component.

3. The package structure of claim 1, wherein the electronic component is an active component, a passive component, or a combination thereof.

4. The package structure of claim 1, wherein the electronic component is electrically connected to the wiring layer in a flip-chip manner.

5. The package structure of claim 1, wherein the plurality of conductive elements are formed on the conductive pads and electrically connected to the first side of the wiring layer.

* * * * *